United States Patent
Itayama (10) Patent No.: US 10,263,175 B2
(45) Date of Patent: Apr. 16, 2019

(54) PIEZOELECTRIC ELEMENT AND PIEZOELECTRIC ELEMENT-APPLIED DEVICE

(71) Applicant: Seiko Epson Corporation, Tokyo (JP)

(72) Inventor: Yasuhiro Itayama, Chino (JP)

(73) Assignee: Seiko Epson Corporation (JP)

( * ) Notice: Subject to any disclaimer, the term of this patent is extended or adjusted under 35 U.S.C. 154(b) by 182 days.

(21) Appl. No.: 15/269,000

(22) Filed: Sep. 19, 2016

(65) Prior Publication Data
US 2017/0092840 A1    Mar. 30, 2017

(30) Foreign Application Priority Data

Sep. 29, 2015  (JP) .................................. 2015-191995
Jul. 25, 2016  (JP) .................................. 2016-145733

(51) Int. Cl.
*H01L 41/187* (2006.01)

(52) U.S. Cl.
CPC .................. *H01L 41/1875* (2013.01)

(58) Field of Classification Search
CPC .......... H01L 41/187; H01L 41/1876
USPC .......... 310/358; 252/62.9 R, 62.9 PZ
See application file for complete search history.

(56) References Cited

U.S. PATENT DOCUMENTS

| 4,765,919 A | * | 8/1988 | Tomita | .................. C04B 35/493 |
| | | | | 252/62.9 PZ |
| 6,142,615 A | | 11/2000 | Qiu et al. | |
| 7,059,711 B2 | | 6/2006 | Aoto et al. | |
| 7,513,608 B2 | | 4/2009 | Aoto et al. | |
| 7,938,515 B2 | | 5/2011 | Aoto et al. | |
| 2007/0197370 A1 | * | 8/2007 | Nakamura | ............ C04B 35/493 |
| | | | | 501/134 |

FOREIGN PATENT DOCUMENTS

| JP | 11-129478 A | 5/1999 |
| JP | 11-207957 A | 8/1999 |
| JP | 2000-328223 A | 11/2000 |
| JP | 2001-302349 A | 10/2001 |
| JP | 2004-260158 A | 9/2004 |
| JP | 2007-178292 A | 7/2007 |

OTHER PUBLICATIONS

Xue-Ting Ren et al., "Crystal Structures and Properties of $Pb(Ni_{1/3},Nb_{2/3})O_3$—$Pb(Zr_{1/2},T_{1/2})O_3$ Thin Films on Silicon Substrates", Energy Harvesting and Systems, vol. 2(3-4), pp. 129-135 (2015).

* cited by examiner

*Primary Examiner* — Derek Rosenau
(74) *Attorney, Agent, or Firm* — Harness, Dickey & Pierce, P.L.C.

(57) ABSTRACT

A piezoelectric element includes a first electrode, a second electrode, and a piezoelectric layer provided between the first and second electrodes. In the piezoelectric element, the piezoelectric layer is made from a perovskite composite oxide represented by Pb(Ni, Nb, Zr, Ti)$O_3$ and the total of the Ni and Nb contents in the perovskite composite oxide is not less than 1 [mol %] and not more than 5 [mol %] based on a total content of elements contained in a B site.

6 Claims, 5 Drawing Sheets

PIEZOELECTRIC ELEMENT AND PIEZOELECTRIC ELEMENT-APPLIED DEVICE

BACKGROUND

1. Technical Field

The present invention relates to a piezoelectric element and a piezoelectric element-applied device that are excellent in displacement properties.

2. Related Art

In general, piezoelectric elements have a piezoelectric layer with electromechanical transducing properties and two electrodes holding the piezoelectric layer therebetween. In recent years, devices (piezoelectric element-applied devices) using such a piezoelectric element as a driving source have been increasingly developed. Examples of such a piezoelectric element-applied device under development include liquid ejecting heads represented by an ink jet recording head, MEMS devices represented by a piezoelectric MEMS device, ultrasonic measuring devices represented by an ultrasonic sensor or the like, and piezoelectric actuators.

A piezoelectric material used for such a piezoelectric layer is expected to have good piezoelectric properties, and as such a piezoelectric material, a composite oxide having a binary perovskite structure (perovskite composite oxides) containing lead titanate ($PbTiO_3$, hereinafter, referred to as "PT") and lead zirconate ($PbZrO_3$, hereinafter, referred to as "PZ"), that is, lead zirconate titanate ($Pb(Zr, Ti)O_3$, hereinafter, referred to as "PZT") is widely known.

In recent years, multicomponent perovskite composite oxides containing a third component in PZT have also been developed, and as such a multicomponent PZT, PZT containing lead nickelate niobate ($Pb(Ni, Nb)O_3$, hereinafter, referred to as "PNN") as a third component (PNN-PZT) is known (e.g., refer to JP-A-11-129478 and JP-A-11-207957).

PNN-PZT, however, lacks sufficient displacement properties desired for higher performance and the like of various apparatuses having a piezoelectric element-applied device mounted therein and displacement properties comparable at least to those of PZT are needed. To obtain excellent displacement properties, selection of a substitution site and a substitution element of a perovskite composite oxide, substitution amount, and the like should be further reviewed for further optimization. Such a problem is not limited to that in piezoelectric elements mounted in ink jet recording heads, and similar problems arise in elements for piezoelectric MEMS devices, ultrasonic sensors, piezoelectric actuators, and the like.

SUMMARY

An advantage of some aspects of the invention is that a piezoelectric element and a piezoelectric element-applied device are capable of improving a displacement amount, having excellent displacement properties, and reducing leakage current.

According to an aspect of the invention, a piezoelectric element includes: a first electrode; a second electrode; and a piezoelectric layer provided between the first and second electrodes. In the piezoelectric element, the piezoelectric layer is made from a perovskite composite oxide represented by formula (1), and a total of Ni and Nb contents in the perovskite composite oxide is not less than 1 [mol %] and not more than 5 [mol %] based on a total content of elements contained in a B site.

$$Pb(Ni,Nb,Zr,Ti)O_3 \qquad (1)$$

In such an aspect, the piezoelectric layer is made from a perovskite composite oxide represented by formula (1), and the total of the Ni and Nb contents in the composite oxide is not less than 1 [mol %] and not more than 5 [mol %] based on the total content of elements contained in a B site, and thus, the piezoelectric element has excellent displacement properties.

In this case, the piezoelectric layer may be made from a perovskite composite oxide represented by formula (2) below.

$$xPb(Ni,Nb)O_3-(1-x)Pb(Zr,Ti)O_3 \qquad (2)$$

(where $0.01 \le x \le 0.05$ is satisfied.)

Accordingly, the piezoelectric element can be improved with respect to the amount of displacement.

In this case, the perovskite composite oxide represented by the formula (1) or (2) contained in the piezoelectric layer preferably has a Ni to Nb molar ratio of 1:2.

Accordingly, the leakage current can be reduced, and the piezoelectric element can be improved with respect to the amount of displacement.

A piezoelectric element-applied device according to another aspect of the invention includes the piezoelectric element according to the above aspect.

In such an aspect, a piezoelectric element-applied device has excellent displacement properties.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention are described below with reference to the drawings. The descriptions below describe one aspect of the invention and may be modified appropriately without departing from the spirit of the invention. In each drawing, like reference symbols indicate like members, and description is omitted as appropriate. In FIGS. 2 to 11, X, Y, and Z represent three spatial axes orthogonal to each other. Herein, the directions of these axes are described as a first direction X (X direction), a second direction Y (Y direction), and a third direction (Z direction). The X and Y directions indicate in-plane directions on a plate, a layer, and a film, and the Z direction indicates a thickness direction or a stacking direction of a plate, a layer, and a film.

First Embodiment

First, an ink jet recording apparatus as an example of a liquid ejecting apparatus is described with reference to FIG. 1.

Figure 1:
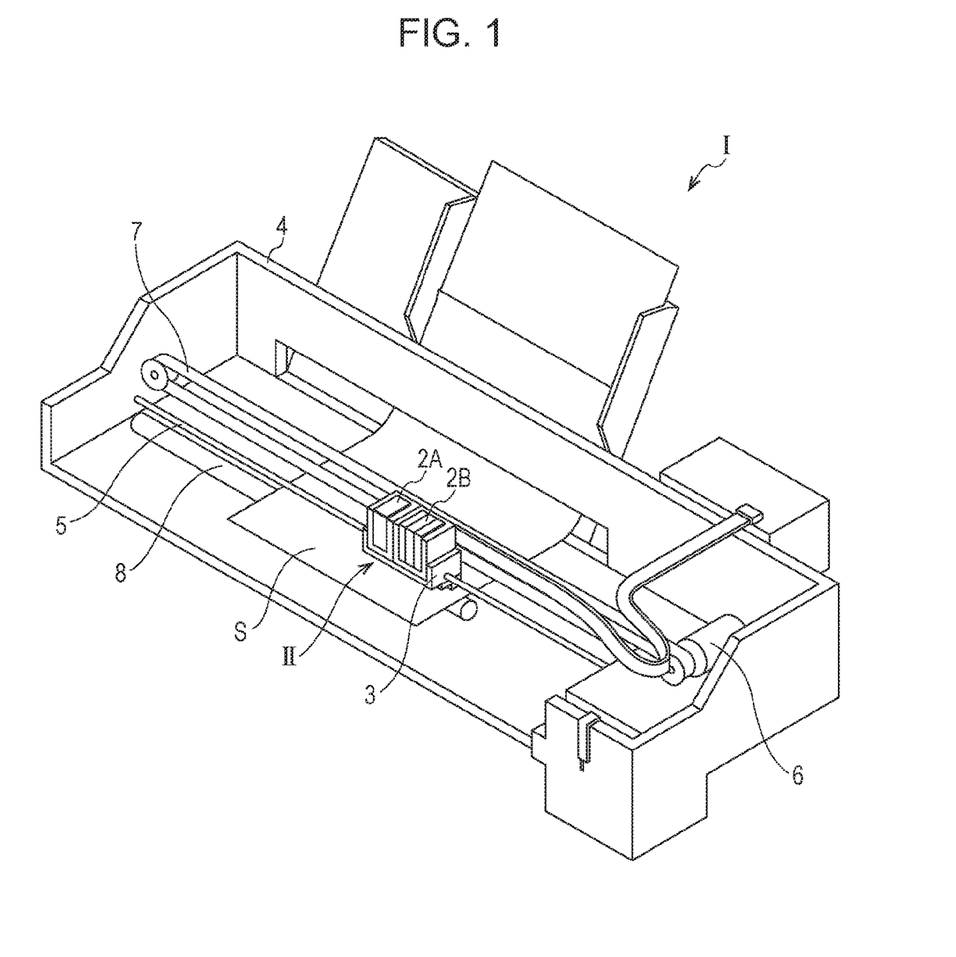
FIG. 1 illustrates a schematic structure of an ink jet recording apparatus.

FIG. 1 illustrates a schematic structure of the ink jet recording apparatus. As illustrated in FIG. 1, the ink jet recording apparatus (recording apparatus I) is provided with an ink jet recording head unit (head unit II) detachably attached to cartridges 2A and 2B. The cartridges 2A and 2B form an ink supply mechanism. The head unit II has a plurality of ink jet recording heads, described later, (recording head 1, refer to FIG. 2, for example) and mounted to a carriage 3. The carriage 3 is provided to be movable in an axial direction along a carriage shaft 5 attached to an apparatus body 4. The head unit II and the carriage 3 are configured to allow discharge of, for example, a black ink composition and color ink composition.

A driving force of a driving motor 6 is transferred to the carriage 3 via a plurality of gears, not shown, and a timing belt 7 to move the carriage 3 having the head unit II mounted thereon along the carriage shaft 5. Meanwhile, the apparatus body 4 is provided with a transport roller 8 as a transport mechanism to transport a recording sheet S, such as paper, as a recording medium. The transport mechanism to transport the recording sheet S is not limited to the transport roller and may be a belt, a drum, or the like.

For the recording head 1, piezoelectric elements 300 according to an embodiment of the invention described later in detail are used as a piezoelectric actuator. The use of the piezoelectric elements 300 enables a decrease in various properties (durability, ink ejecting properties, and the like) in the recording apparatus I to be suppressed.

Figure 3:
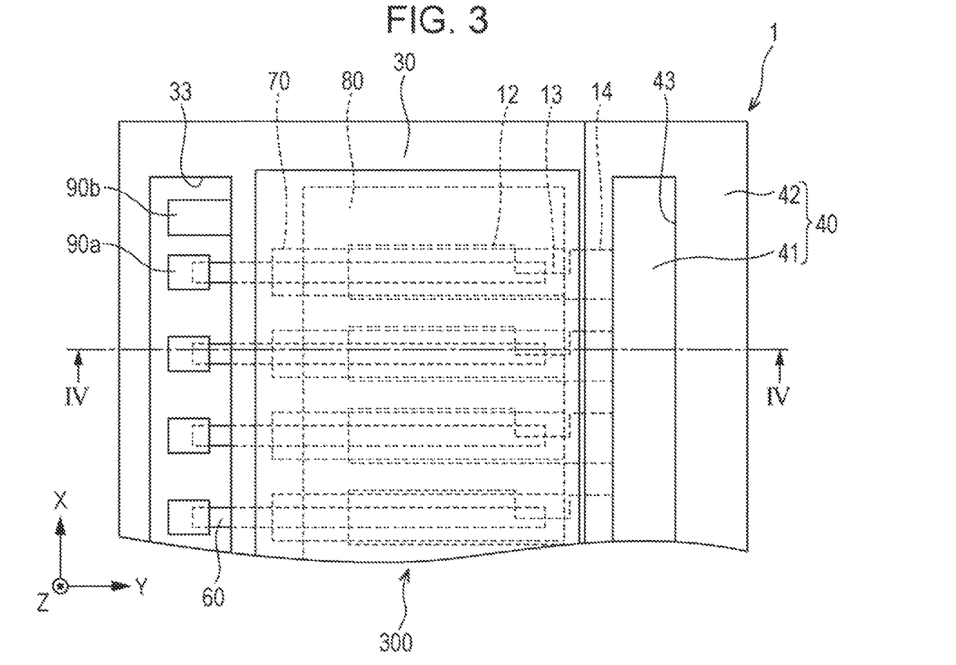
FIG. 3 is a plan view illustrating a schematic structure of the ink jet recording head.
Figure 4:
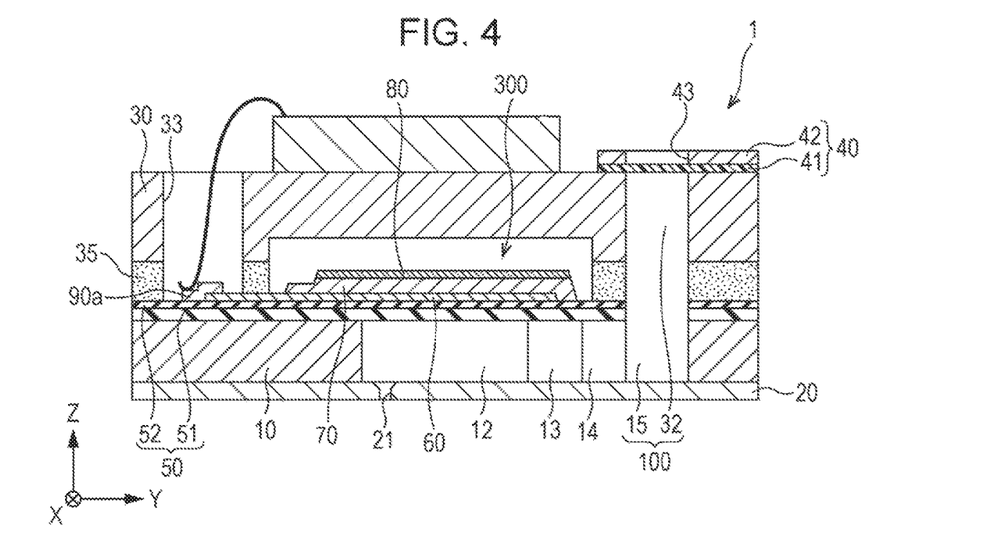
FIG. 4 is a cross-sectional view illustrating a schematic structure of the ink jet recording head.

Next, the ink jet recording head as an example of the liquid ejecting head mounted on the liquid ejecting apparatus is described with reference to FIGS. 2 through 4.

Figure 2:
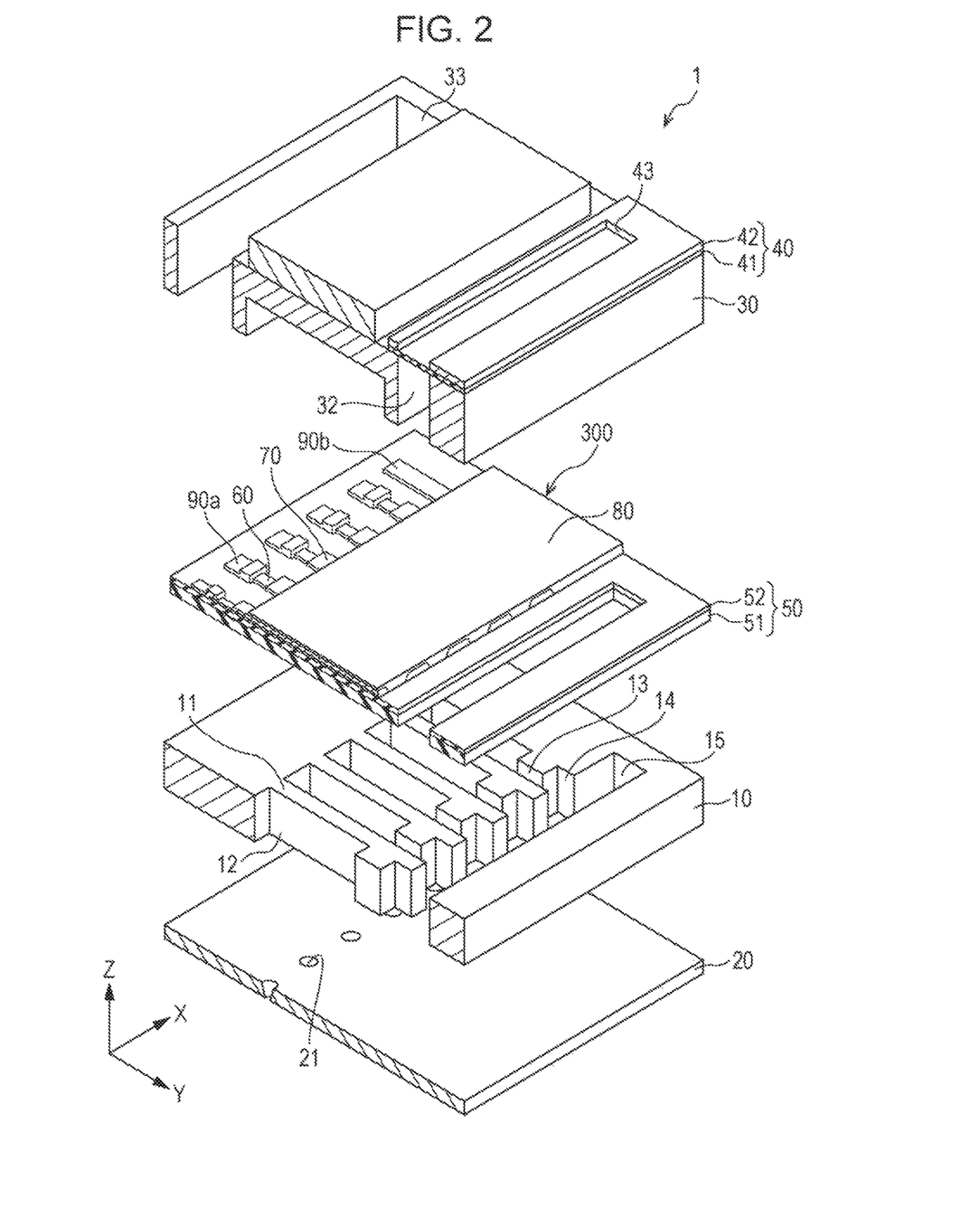
FIG. 2 is an exploded perspective view illustrating a schematic structure of an ink jet recording head.

FIG. 2 is an exploded perspective view of the ink jet recording head. FIG. 3 is a plan view of a flow channel formation substrate on the piezoelectric element side (plan view of the flow channel formation substrate taken from the piezoelectric element side), and FIG. 4 is a cross-sectional view in accordance with line IV-IV in FIG. 3.

A flow channel formation substrate 10 (hereinafter, referred to as a "substrate 10") is made of, for example, a silicon single crystal substrate and has pressure generation chambers 12 formed therewith. The pressure generation chambers 12 separated by a plurality of partitions 11 are provided in parallel in a direction of a plurality of nozzle openings 21 that discharge an ink of the same color (in the X direction). The material for the substrate 10 is not limited to silicon and may be SOI, glass, or the like.

In the substrate 10, an ink supply channel 13 and a communication channel 14 are formed at one end side in the Y direction of the pressure generation chambers 12. Outside the communication channel 14 (on the +Y direction side), a communication portion 15 is formed. The communication portion 15 forms part of a manifold 100. The manifold 100 is an ink chamber common to each pressure generation chamber 12. In such a manner, in the substrate 10, a liquid flow channel composed of the pressure generation chambers 12, the ink supply channel 13, the communication channel 14, and the communication portion 15 is formed.

To one surface (surface on the −Z direction side) of the substrate 10, a nozzle plate 20 made of, for example, SUS is joined. The nozzle plate 20 is provided with the nozzle openings 21 in parallel in the X direction. The nozzle openings 21 are in communication with the respective pressure generation chambers 12. The nozzle plate 20 may be joined to the substrate 10 by an adhesive, a heat welding film, or the like.

On the other surface (surface on the +Z direction side) of the substrate 10, a diaphragm 50 is formed. The diaphragm 50 is formed of, for example, an elastic film 51 formed on the substrate 10 and an insulator film 52 formed on the elastic film 51. The elastic film 51 is made from, for example, silicon dioxide ($SiO_2$). The insulator film 52 is made from, for example, zirconium oxide ($ZrO_2$).

Over the insulator film 52, the piezoelectric elements 300 including first electrodes 60, piezoelectric layers 70, and a second electrode 80 are formed. Although not illustrated in FIGS. 2 through 4, a close adhesion layer 56 (refer to FIGS. 5 through 11) is provided between the insulator film 52 and the first electrodes 60 to improve close adhesion between the insulator film 52 and the first electrodes 60. The close adhesion layer 56 may be omitted.

The first electrode 60 is provided for each pressure generation chamber 12. In other words, the first electrode 60 is configured as an individual independent electrode for each pressure generation chamber 12. A piezoelectric layer 70 is also provided for each pressure generation chamber 12.

The second electrode 80 is provided continuously in the X direction over the first electrodes 60, the piezoelectric layers 70, and the diaphragm 50. In other words, the second electrode 80 is formed as a common electrode. Instead of the second electrode 80, the first electrode 60 may be formed as a common electrode.

The first electrodes 60 have an end (end on the −Y direction side) exposed from the end on the −Y direction side of the piezoelectric layers 70. The ends on the −Y direction side of the first electrodes 60 are connected to lead electrodes 90a.

To the second electrode 80, a lead electrode 90b is connected. The lead electrodes 90a and the lead electrode 90b are formed with a single layer of a material constituting the lead electrodes 90a and the lead electrode 90b over the entire surface of the substrate 10, followed by patterning this layer in a predetermined shape to be formed simultaneously.

Over the substrate 10 having the piezoelectric elements 300 formed therewith, a protective substrate 30 is joined by an adhesive 35. The protective substrate 30 has a manifold portion 32. The manifold portion 32 forms at least part of the manifold 100. The manifold portion 32 according to the present embodiment penetrates the protective substrate 30 in a thickness direction (Z direction) and is further formed over the pressure generation chambers 12 in the width direction (X direction). The manifold portion 32 is in communication with the communication portion 15 of the substrate 10 as described above. Such a structure forms the manifold 100 to be an ink chamber shared with pressure generation chambers 12.

To the protective substrate 30, a compliance substrate 40 made from a sealing film 41 and a fixation plate 42 is joined. A region of the fixation plate 42 facing the manifold 100 is an opening 43 formed by completely removing the fixation plate 42 in the thickness direction (Z direction). One surface (surface on the +Z direction side) of the manifold 100 is sealed by only the sealing film 41 having flexibility.

Such an ink jet recording head discharges an ink droplet in the following manner. First, ink is received from an ink inlet connected to an external ink supply mechanism, not shown, to fill a space extending from the manifold 100 to the nozzle openings 21 with the ink. Then, in accordance with a recording signal from a driving circuit, not shown, a voltage is applied between the second electrode 80 and the respective first electrodes 60 corresponding to the pressure generation chambers 12 for deflection deformation of the piezoelectric elements 300. As a result, the pressure in each pressure generation chamber 12 increases, and ink droplets are discharged from the nozzle openings 21.

Next, the piezoelectric elements 300 are described further in detail. The piezoelectric elements 300 include the first electrodes 60, the second electrode 80, and the piezoelectric layers 70 provided between the first electrodes 60 and the second electrode 80. The first electrodes 60 have a thickness of approximately 50 nm. The piezoelectric layers 70 are so-called piezoelectric thin films having a thickness of not less than 50 nm and not more than 2000 nm. The second electrode 80 has a thickness of approximately 50 nm. The thickness of each element mentioned here is merely an example and may be changed without departing from the spirit of the invention.

The materials for the first electrodes 60 and the second electrode 80 are not particularly limited as long as the material is capable of maintaining conductivity. Examples of such a material include the noble metals, such as platinum (Pt) and iridium (Ir), and conductive oxides represented by a lanthanum-nickel oxide (LNO) and the like.

The piezoelectric layers 70 are constituted by a piezoelectric material made from a composite oxide (perovskite composite oxide) having a perovskite structure containing at least each of the metal elements of lead (Pb), nickel (Ni), niobium (Nb), zirconium (Zr), and titanium (Ti).

In this context, the perovskite composite oxide is a kind of a composite oxide represented by general formula $ABO_3$. The perovskite composite oxide constitutes an octahedron in which oxygen is 12-coordinated at an A site and oxygen is 6-coordinated at a B site. The composite oxide constituting the piezoelectric layers 70 contains Pb at the A site and Ni, Nb, Zr, and Ti at the B site.

The composite oxide constituting the piezoelectric layers 70 is considered a mixed crystal of lead nickelate niobate (Pb(Ni, Nb)$O_3$, hereinafter, referred to as "PNN") and lead zirconate titanate (Pb(Zr, Ti)$O_3$, hereinafter, referred to as "PZT") or a solid solution in which PNN and PZT are uniformly dissolved, whereas PNN and PZT are not detected singly in an x-ray diffraction pattern. Accordingly, the composition of the composite oxide constituting the piezoelectric layers 70 is denoted by formula (3) below.

$$Pb(Ni, Nb, Zr, Ti)O_3 \quad (3)$$

In the composite oxide of formula (3), from the perspective of securing a sufficient displacement in the piezoelectric elements 300, the total Ni and Nb contents in the composite oxide based on a total content of elements contained in the B site is preferably less than 6 [mol %] and even more preferably not less than 1 [mol %] and not more than 5 [mol %].

In addition, from the perspective of both securing a sufficient displacement in the piezoelectric elements 300 and reducing leakage current, the total Ni and Nb contents in the composite oxide is more preferably less than 3 [mol %] and even more preferably satisfies not less than 1 [mol %] and not more than 2.5 [mol %].

The expression of the composition of the perovskite composite oxide represented by formula (3) is based on stoichiometry. As long as the composite oxide constituting the piezoelectric layers 70 has a perovskite structure, not only deviation in the composition unavoidable due to lattice mismatch, oxygen deficiency, and the like but also partial substitution of elements, such as potassium (K), sodium (Na), lanthanum (La), samarium (Sm), cerium (Ce), aluminum (Al), and cobalt (Co), for example, and the like are allowed. For example, where the stoichiometric ratio is 1, composite oxides in a range of not less than 0.85 and not more than 1.20 are allowed. In addition, in some cases, the composite oxides having the same ratio between the elements at the A site and the elements at the B site may be regarded as an identical composite oxide even when they are represented differently by general formulae.

Meanwhile, the composite oxide constituting the piezoelectric layers 70 may be formed using a piezoelectric material made from a perovskite composite oxide represented by formula (4) below.

$$xPb(Ni,Nb)O_3—(1-x)Pb(Zr,Ti)O_3 \quad (4)$$

(where $0.01 \leq x \leq 0.05$ is satisfied.)

In formula (4), from the perspective of securing a sufficient displacement in the piezoelectric elements 300, it is preferable to satisfy $x<0.06$ and even more preferable to satisfy $0.01 \leq x \leq 0.05$.

In addition, in formula (4), from the perspective of both securing a sufficient displacement in the piezoelectric elements 300 and reducing leakage current, it is more preferred to satisfy $x<0.03$ and even more preferred to satisfy $0.01 \leq x \leq 0.025$.

PNN and PZT are known piezoelectric materials having a perovskite structure, and such materials having various types of composition exist. Examples of PNN and PZT of such a composition include those with some of the metal elements (Pb, Ni, Nb, Zr, and Ti) and oxygen included in PNN and PZT is deficient or excessive, those with some of the elements substituted by another element, and the like. Accordingly, the expression PNN and PZT includes those that deviate from the stoichiometric composition due to deficiency or excess, as long as the basic properties are not changed, and those having some of the elements is substituted by another element as the range of PNN and PZT.

From the perspective of securing a sufficient displacement in the piezoelectric elements 300 and reducing leakage current, the composite oxide constituting the piezoelectric layers 70 preferably has a molar ratio of Ni to Nb included in the composition of 1:2.

The piezoelectric layers 70 are formed with the piezoelectric material made from the perovskite composite oxide represented by formula (3) or (4), thereby enabling preferential orientation of crystals of the composite oxide to a (100) plane. The piezoelectric material is capable of naturally orienting to the (100) plane without using an orientation control layer. In the present embodiment, "preferential orientation to the (100) plane" means that a ratio of crystals oriented to the (100) plane is greater than a ratio of crystals oriented to a (110) plane or a (111) plane. The ratio is, for example, 60% or more, preferably 75% or more, and more preferably 80% or more.

Next, an example of a method for producing a piezoelectric element mounted in an ink jet recording head is described together with a method for producing the ink jet recording head with reference to FIGS. 5 through 11.

Figure 5:
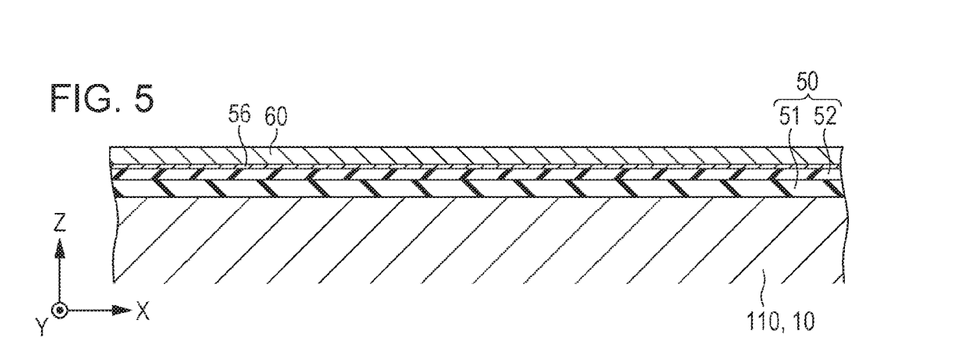
FIG. 5 illustrates an example of producing the ink jet recording head.

First, as illustrated in FIG. 5, a silicon substrate 110 (flow channel formation substrate 10) is prepared. Then, the silicon substrate 110 is subjected to thermal oxidation to form the elastic film 51 made from silicon dioxide ($SiO_2$) on the surface. Further, on the elastic film 51, a zirconium film is formed by sputtering and subjected to thermal oxidation, thereby providing the insulator film 52 made from zirconium oxide ($ZrO_2$). The diaphragm 50 made from the elastic film 51, and the insulator film 52 is thus formed.

Subsequently, on the insulator film 52, the close adhesion layer 56 made from titanium oxide ($TiO_x$) is formed. The close adhesion layer 56 may be formed by sputtering, thermal oxidation, or the like. Note that the close adhesion layer 56 may be omitted. Then, on the close adhesion layer 56, the first electrode 60 is formed. The first electrode 60 may be formed by, for example, vapor phase film deposition, such as sputtering, vacuum deposition (PVD), and laser ablation, or liquid phase film deposition, such as spin coating, and the like.

Figure 6:
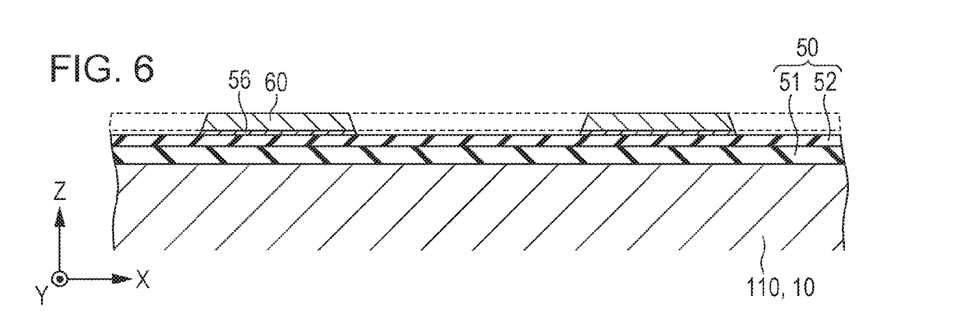
FIG. 6 illustrates an example of producing the ink jet recording head.

Subsequently, as illustrated in FIG. 6, the close adhesion layer 56 and the first electrodes 60 are patterned simultaneously. The patterning of the close adhesion layer 56 and the first electrodes 60 may be performed by, for example, dry etching, such as reactive ion etching (RIE) and ion milling, and wet etching using an etchant. The shapes in the patterning of the close adhesion layer 56 and the first electrodes 60 are not particularly limited.

Figure 7:
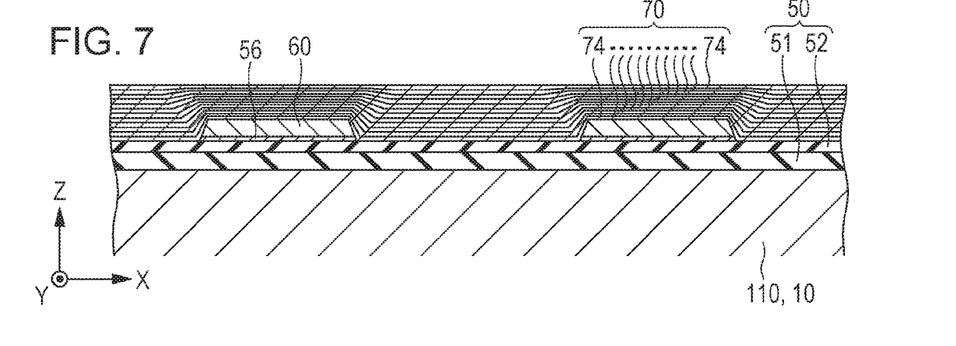
FIG. 7 illustrates an example of producing the ink jet recording head.

Then, as illustrated in FIG. 7, the piezoelectric layers 70 are formed. A method of forming the piezoelectric layers 70 is not limited. For example, a metal-organic decomposition (MOD) method in which a solution containing a metal complex (precursor solution) is applied and dried and further sintered at high temperatures to obtain a metal oxide and a chemical solution (wet) method, such as a sol-gel method, may be used. As other examples, the piezoelectric layers 70 may be produced by a liquid phase method or a solid phase method, such as laser ablation, sputtering, pulse laser deposition (PLD), chemical vapor deposition (CVD), and aerosol deposition.

For example, the piezoelectric layers 70 formed by a wet method have a plurality of piezoelectric films 74 formed by a series of steps consisting of a step of forming a precursor film by applying a precursor solution (application step), a step of drying the precursor film (drying step), a step of degreasing the dried precursor film by heating (degreasing step), and a step of sintering the degreased precursor film (sintering step), details of which are described later. That is, the piezoelectric layers 70 are formed by repeating the series of steps from the application step to the sintering step a plurality of times. In the series of steps from the application step to the sintering step, the sintering step may be performed after repeating a plurality of times from the application step to the degreasing step.

Layers and films formed by a wet method have an interface. In layers and films formed by a wet method, signs of application or sintering remain, and such signs become "an interface" that may be confirmed by observing the cross section or analyzing the concentration distribution of elements in the layer (or in the film). Although "interface" means a border between layers or films in the strict sense, it encompasses, in this context, the vicinity of a border between layers or films. When the cross section of a layer or a film formed by a wet method is observed, such an interface is confirmed as an area having a deeper color than the rest or an area having a lighter color than the rest in the vicinity of the border against an adjacent layer or an adjacent film. When the concentration distribution of elements is analyzed, such an interface is confirmed as an area of higher element concentration than the rest or an area of lower element concentration than the rest in the vicinity of the border against an adjacent layer or an adjacent film. The piezoelectric layers 70 are formed by repeating a series of steps from the application step to the sintering step a plurality of times or by performing the sintering step after repeating the steps from the application step to the degreasing step a plurality of times (formed with a plurality of piezoelectric films 74). The piezoelectric layers 70 thus have a plurality of interfaces corresponding to the respective piezoelectric films 74.

An example of a specific procedure for the formation of the piezoelectric layers 70 by a wet method is as follows. First, a precursor solution is prepared that is to form the piezoelectric layers 70 (preparation step) is made from an MOD solution or a sol containing a metal complex. Then, a precursor film is formed by applying the precursor solution on the first electrodes 60 by using spin coating or the like (application step). Then, the precursor film is dried for a certain time by heating at a predetermined temperature, for example, approximately from 130° C. to 250° C. (drying step), and the dried precursor film is further kept for a certain time after heating at a predetermined temperature, for example, approximately from 300° C. to 450° C. for degreasing (degreasing step). Further, the degreased precursor film is heated at a higher temperature, for example, approximately from 650° C. to 800° C. and kept at this temperature for a certain time for crystallization to form the piezoelectric film 74 (sintering step). Then, by repeating the application step, the drying step, the degreasing step, and the sintering step a plurality of times, the piezoelectric layers 70 made from the multilayered piezoelectric films 74 illustrated in FIG. 7 are formed.

The precursor solution described above is obtained by dissolving or dispersing a metal complex that may form the perovskite composite oxide containing PNN and PZT described above in an organic solvent by sintering. In other words, the precursor solution contains each element of Pb, Ni, Nb, Zr, and Ti as the central metal of the metal complex. At this point, in the precursor solution, a metal complex containing an element other than the above elements, for example, a metal complex containing an additive, such as K, Na, La, Sm, Ce, Al, and Co, may be further mixed.

As the metal complex containing the above elements, an alkoxide, an organic salt, a β-diketone complex, and the like, for example, may be used. In the precursor solution, these metal complexes may be mixed at a ratio corresponding to a desired molar ratio of Pb, Ni, Nb, Zr, and Ti contained in the perovskite composite oxide.

Examples of the metal complex containing Pb used for preparation of the precursor solution include lead acetate and the like. Examples of the metal complex containing Ni include nickel acetate, nickel nitrate, nickel 2-ethyl hexanoate, and the like. Examples of the metal complex containing Nb include niobium pentaethoxide, niobium 2-ethyl hexanoate, and the like. Examples of the metal complex containing Zr include zirconium acetylacetonato, zirconium tetraacetylacetonato, zirconium monoacetylacetonato, zirconium bisacetylacetonato, and the like. Examples of the metal complex containing Ti include titanium isopropoxide, titanium 2-ethyl hexanoate, titanium (di-i-propoxide) bis(acetylacetonato), and the like. Here, two or more types of metal complex may be used in combination.

Examples of the organic solvent used for preparation of the precursor solution include propanol, butanol, pentanol, hexanol, octanol, ethylene glycol, propylene glycol, octane, decane, cyclohexane, xylene, toluene, tetrahydrofuran, acetic acid, octylic acid, 2-n butoxy ethanol, n-octane, a mixed solvent thereof, and the like. The precursor solution may contain an additive to stabilize dispersion of metal complexes containing Pb, Ni, Nb, Zr, and Ti. Examples of such an additive include 2-ethyl hexane acid and the like.

Examples of a heater used in the drying step, the degreasing step, and the sintering step include a rapid thermal annealing (RTA) apparatus to heat by using radiation of an infrared lamp, a hot plate, and the like.

Figure 8:
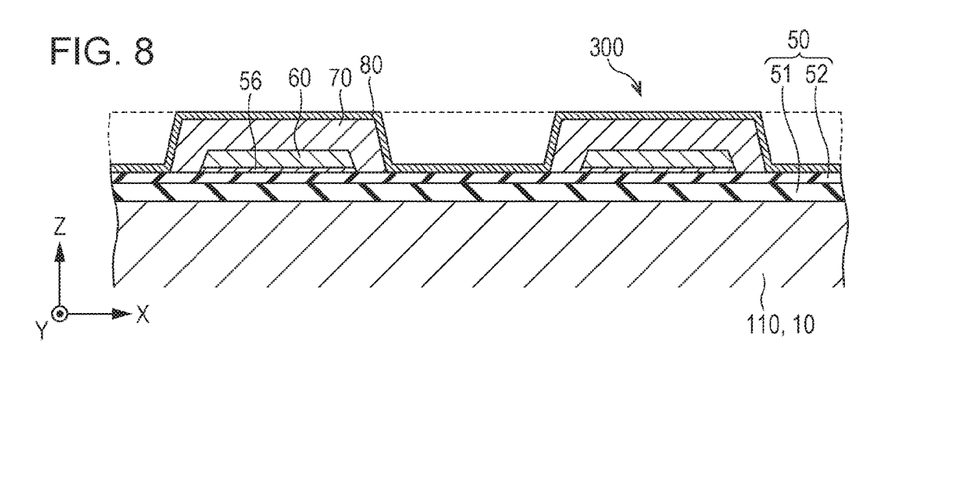
FIG. 8 illustrates an example of producing the ink jet recording head.

Subsequently, as illustrated in FIG. 8, the piezoelectric layers 70 made from the plurality of piezoelectric films 74 are patterned. The patterning may be performed by dry etching, such as so-called reactive ion etching and ion milling, or wet etching using an etchant. The shape for patterning the piezoelectric layers 70 is not particularly limited. Then, on the patterned piezoelectric layers 70, the second electrode 80 is formed. The second electrode 80 may be formed by the same method as that for the first electrodes 60. By the above steps, the piezoelectric elements 300 provided with the first electrodes 60, the piezoelectric layers 70, and the second electrode 80 are completed. In other words, the areas where the first electrodes 60, the piezoelectric layers 70, and the second electrode 80 overlap become the piezoelectric elements 300.

Figure 9:
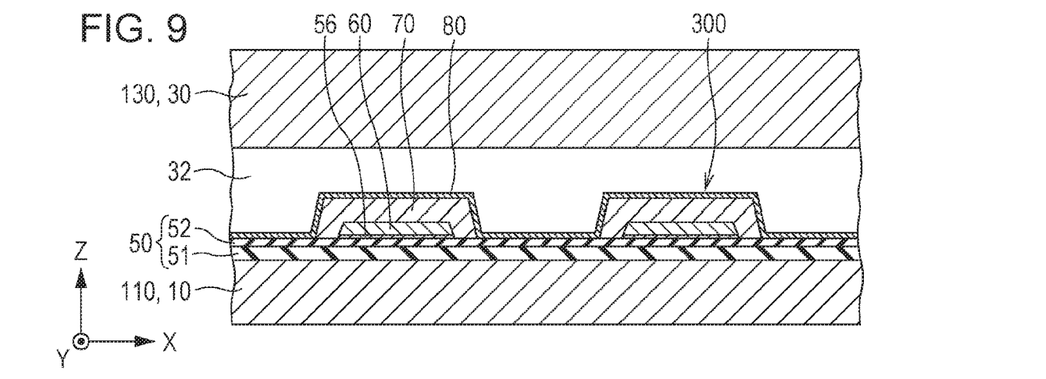
FIG. 9 illustrates an example of producing the ink jet recording head.
Figure 10:
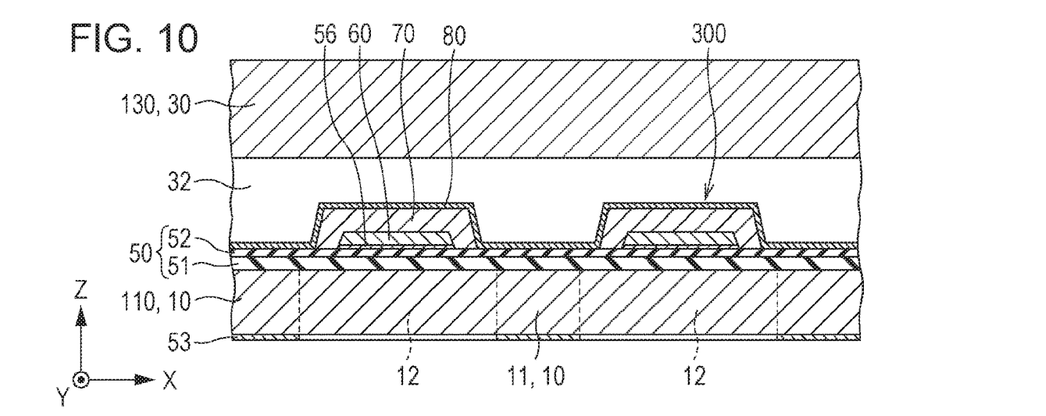
FIG. 10 illustrates an example of producing the ink jet recording head.
Figure 11:
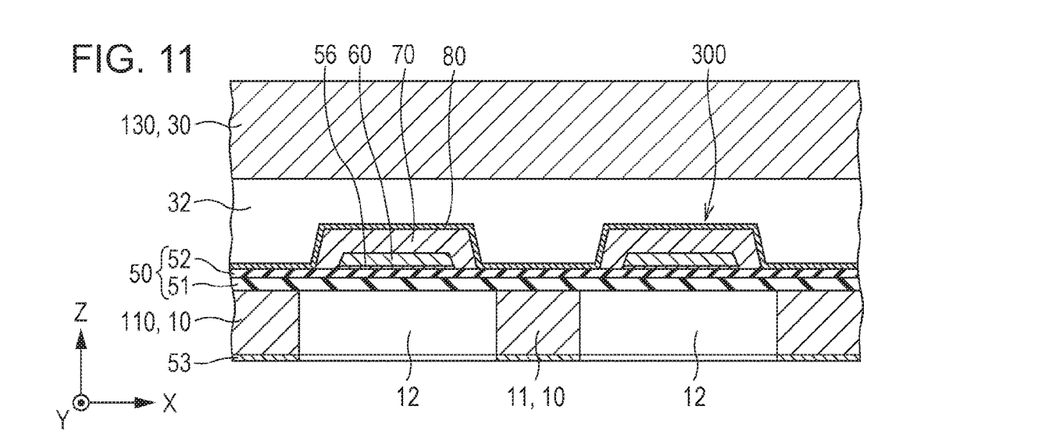
FIG. 11 illustrates an example of producing the ink jet recording head.

Then, as illustrated in FIG. 9, over the surface of the silicon substrate 110 on the piezoelectric element 300 side, a protective substrate wafer 130 (protective substrate 30) is joined via an adhesive, not shown. Then, a surface of the protective substrate wafer 130 is scraped to reduce the thickness thereof. In the protective substrate wafer 130, the manifold portion 32 and a through hole 33, not shown, (refer to FIGS. 2 through 4) are formed. Subsequently, as illustrated in FIG. 10, on a surface of the silicon substrate 110 opposite to the piezoelectric element 300 side, a mask film 53 is formed and patterned in a predetermined shape. Then, as illustrated in FIG. 11, via the mask film 53, the silicon substrate 110 is subjected to anisotropic etching (wet etching) using an alkaline solution, such as KOH. In such a manner, in addition to the pressure generation chambers 12 corresponding to the individual piezoelectric elements 300, the ink supply channel 13, the communication channel 14, and the communication portion 15, not shown, (refer to FIGS. 2 and 4) are formed.

Then, unused areas in peripheral portions of the silicon substrate 110 and the protective substrate wafer 130 are cut and removed by dicing or the like. Further, to the surface of the silicon substrate 110 opposite to the piezoelectric element 300 side, the nozzle plate 20, not shown, is joined (refer to FIGS. 2 and 4). In addition, to the protective substrate wafer 130, the compliance substrate 40, not shown, is joined (refer to FIGS. 2 through 4). By the above steps, integrated chips of the recording head 1 are completed. The integrated article is divided into individual chips to obtain the recording head 1 (refer to FIGS. 2 through 4).

EXAMPLES

Aspects of the invention are described below even more specifically with reference to the Examples. It should be noted that aspects of the invention are not limited to Examples below.

Preparation of Sample 1

First, a single crystal silicon (Si) substrate (silicon substrate 110) on the (100) plane was subjected to thermal oxidation to form a silicon oxide ($SiO_2$) film (elastic film 51) with a film thickness of 1200 nm on the surface of the Si substrate. Subsequently, on the $SiO_2$ film, a titanium film with a film thickness of 40 nm was prepared. The titanium film was subjected to thermal oxidation to prepare a titanium oxide ($TiO_x$) film (close adhesion layer 56). Subsequently, on the $TiO_x$ film, a platinum (Pt) film (first electrodes 60) oriented to the (111) plane with a film thickness of 100 nm was formed by RF magnetron sputtering.

Then, lead (II) acetate trihydrate, nickel (II) acetate tetrahydrate, penta-n-butoxy niobium, tetrakis(2,4-pentanedionate) zirconium (IV), and titanium tetraisopropoxide were mixed, and butyl Cellosolve as a main solvent, diethanol amine as a stabilizer, and polyethylene glycol as a thickener were added to prepare a precursor solution (preparation step). Subsequently, the precursor solution was dropped on the first electrodes 60, and after rotation of the substrate at 500 rpm for six seconds, the substrate was rotated at 3000 rpm for 20 seconds to form a precursor film on the first electrodes 60 by spin coating (application step). Next, the substrate was placed on a hot plate to dry the precursor film at 180° C. for two minutes (drying step). Next, the precursor film was degreased with the hot plate at 380° C. for two minutes (degreasing step). Next, the procedure from the application step to the degreasing step described above was repeated twice. The precursor film was then sintered by an RTA apparatus in an oxygen atmosphere at 700° C. for five minutes to obtain a perovskite composite oxide film (piezoelectric film 74) (sintering step).

In such a manner, sintering was performed after repeating the steps from the application step to the degreasing step described above twice, and such a procedure was repeated six times to perform film deposition of a precursor film 12 times in total to form a perovskite composite oxide layer (piezoelectric layer 70). The ratio of the composition of each metal prepared in the precursor solution showed almost no deviation from the ratio of the composition of piezoelectric layer 70.

Then, on the piezoelectric layer 70, a platinum (Pt) film (second electrode 80) with a film thickness of 100 nm was formed by RF magnetron sputtering to produce a sample 1 (piezoelectric element 300).

The composition of the piezoelectric layer 70 in the sample 1 and the results of measuring a cantilever displacement (hereinafter, referred to as "a displacement") and leakage current of the sample 1 described later are indicated in Table 1 below. The results of measuring film thickness, relative dielectric constant, and Young's modulus of sample 1 described later and the piezoelectric voltage coefficient g31 calculated using the above parameters are indicated in Table 2 below. The composition of the piezoelectric layers 70 in samples 2 through 11 described later and the results of measuring the displacement and the leakage current of each sample are also indicated in Table 1, similar to that for sample 1. In addition, the results of measuring film thicknesses, relative dielectric constants, and Young's moduli in the samples 2 through 8 and the sample 11 described later and piezoelectric voltage coefficients g31 calculated using the above parameters are also indicated in Table 2, similar to that for sample 1.

Preparation of Sample 2 Through Sample 11

The samples 2 through 11 were prepared in the same manner as the sample 1, other than preparing each precursor solution that was prepared such that the molar ratio of Pb, Ni, Nb, Zr, and Ti contained in the piezoelectric layer 70 matched the stoichiometric ratio indicated in Table 1 below.

TABLE 1

| Sample Number | Ratio of Composition | Displacement (nm) | Contrast of Displacement (vs. Sample 11) | Leakage Current (A/cm$^2$) | Evaluation |
|---|---|---|---|---|---|
| 1 | $0.01Pb(Ni_{1/3}Nb_{2/3})O_3$—$0.99Pb(Zr_{0.52}Ti_{0.48})O_3$ | 1396 | 108% | 1.31E−06 | ⊙ |
| 2 | $0.02Pb(Ni_{1/3}Nb_{2/3})O_3$—$0.98Pb(Zr_{0.52}Ti_{0.48})O_3$ | 1408 | 109% | 1.33E−06 | ⊙ |
| 3 | $0.25Pb(Ni_{1/3}Nb_{2/3})O_3$—$0.975Pb(Zr_{0.52}Ti_{0.48})O_3$ | 1634 | 126% | 9.88E−07 | ⊙ |
| 4 | $0.03Pb(Ni_{1/3}Nb_{2/3})O_3$—$0.97Pb(Zr_{0.52}Ti_{0.48})O_3$ | 1455 | 112% | 2.27E−06 | ○ |
| 5 | $0.04Pb(Ni_{1/3}Nb_{2/3})O_3$—$0.96Pb(Zr_{0.52}Ti_{0.48})O_3$ | 1401 | 108% | 1.85E−06 | ○ |
| 6 | $0.05Pb(Ni_{1/3}Nb_{2/3})O_3$—$0.95Pb(Zr_{0.52}Ti_{0.48})O_3$ | 1344 | 104% | 1.92E−06 | ○ |
| 7 | $0.06Pb(Ni_{1/3}Nb_{2/3})O_3$—$0.94Pb(Zr_{0.52}Ti_{0.48})O_3$ | 1252 | 97% | 6.81E−06 | X |
| 8 | $0.005Pb(Ni_{1/3}Nb_{2/3})O_3$—$0.975Pb(Zr_{0.52}Ti_{0.48})O_3$ | 1113 | 85% | 2.24E−06 | X |
| 9 | $Pb((Zr_{0.52}Ti_{0.48})_{0.98}Ni_{0.02})O_3$ | 1013 | 78% | 8.79E−06 | X |
| 10 | $Pb((Zr_{0.52}Ti_{0.48})_{0.98}Ni_{0.02})O_3$ | 1286 | 99% | 7.87E−06 | X |
| 11 | $Pb(Zr_{0.52}Ti_{0.48})O_3$ | 1296 | 100% | 1.34E−06 | — |

The evaluation results for the amounts of displacement and the leakage currents of the measured samples 1 through 11 are indicated in Table 1. In Table 1, with reference to the displacement and the leakage current in the sample 11, "⊙" denotes a sample having an increased displacement and reduced leakage current, "○" denotes a sample having an increased displacement and similar leakage current, and "×" denotes a sample having a reduced displacement and similar or increased leakage current.

TABLE 2

| Sample Number | Ratio of Composition | Film Thickness (nm) | Relative Dielectric Constant (0 V @ 1 kHz) | Young's Modulus (GPs) | g31 Constant × 10$^{-3}$ (Vm/N) | Evaluation |
|---|---|---|---|---|---|---|
| 1 | $0.01Pb(Ni_{1/3}Nb_{2/3})O_3$—$0.99Pb(Zr_{0.52}Ti_{0.48})O_3$ | 1180 | 1444 | 88.69 | 8.95 | ○ |
| 2 | $0.02Pb(Ni_{1/3}Nb_{2/3})O_3$—$0.98Pb(Zr_{0.52}Ti_{0.48})O_3$ | 1190 | 1344 | 87.53 | 10.22 | ○ |
| 3 | $0.025Pb(Ni_{1/3}Nb_{2/3})O_3$—$0.975Pb(Zr_{0.52}Ti_{0.48})O_3$ | 1230 | 1470 | 88.51 | 9.64 | ○ |
| 4 | $0.03Pb(Ni_{1/3}Nb_{2/3})O_3$—$0.97Pb(Zr_{0.52}Ti_{0.48})O_3$ | 1190 | 1333 | 89.68 | 10.19 | ○ |
| 5 | $0.04Pb(Ni_{1/3}Nb_{2/3})O_3$—$0.96Pb(Zr_{0.52}Ti_{0.48})O_3$ | 1200 | 1391 | 91.53 | 10.17 | ○ |
| 6 | $0.05Pb(Ni_{1/3}Nb_{2/3})O_3$—$0.95Pb(Zr_{0.52}Ti_{0.48})O_3$ | 1200 | 1380 | 90.78 | 9.93 | ○ |
| 7 | $0.06Pb(Ni_{1/3}Nb_{2/3})O_3$—$0.94Pb(Zr_{0.52}Ti_{0.48})O_3$ | 1220 | 1364 | 92.14 | 8.41 | X |
| 8 | $0.005Pb(Ni_{1/3}Nb_{2/3})O_3$—$0.975Pb(Zr_{0.52}Ti_{0.48})O_3$ | 1210 | 1511 | 86.98 | 8.69 | X |
| 11 | $Pb(Zr_{0.52}Ti_{0.48})O_3$ | 1330 | 1826 | 70.82 | 8.87 | — |

The evaluation results of the piezoelectric voltage coefficients g31 of the measured samples 1 through 8 are indicated in Table 2. In Table 2, with reference to the piezoelectric voltage coefficient g31 in the sample 11, "○" denotes a sample having a large piezoelectric voltage coefficient g31 and "×" denotes a sample having a small piezoelectric voltage coefficient g31. A sample evaluated as "○" is, when applied to various sensors, expected to have a performance advantage compared with a sensor to which PZT is applied.

Test Example 1

To the samples 1 through 11, a triangular wave at a frequency of 100 Hz and a voltage of 20 V was applied using a laser displacement meter at room temperature (25° C.) and an electrode pattern with an electrode area of 0.3 cm$^2$ to obtain the displacement, and the result is indicated in Table 1. The size of the cantilever was 1.5 cm in full length, 0.4 cm in width, and 625 μm in substrate thickness.

Table 1 revealed that the samples 1 through 6 having a PNN content of not less than 1 [mol %] and not more than 5 [mol %] had the amounts of displacement greater than that of the sample 11.

In contrast, from the results in Table 1, it was found that the sample 7 having a PNN content of 6 [mol %] and the sample 8 of 0.5 [mol %] had the amounts of displacement smaller than that of the sample 11. It was also found that the samples 9 and 10 containing neither Ni nor Nb had the amounts of displacement smaller than the displacement of the sample 11. It was also found that the samples 9 and 10 had the amounts of displacement smaller than those in the samples 1 through 6 having the molar ratio of Ni to Nb of 1:2.

Test Example 2

To the samples 1 through 11, a voltage of ±80 V was applied to obtain the relationship between the electric current density and the voltage (I-V curve). The I-V curve was measured in air and kept for two seconds during the measurement, using "4140B" manufactured by Hewlett-Packard Company. The measurement was carried out using a light shielded prober by eliminating the influence of photovoltage and the like. Then, from the I-V curve thus obtained, leakage current at an applied voltage of 20 V was obtained, the results of which are indicated in Table 1.

From the results of Table 1, it was found that the samples 1 through 3 having a PNN content of not less than 1 [mol %] and not more than 2.5 [mol %] had leakage currents smaller than the leakage current of the sample 11. It was also found that the samples 4 through 6 having a PNN content of not less than 3 [mol %] and not more than 5 [mol %] had the leakage currents similar to the leakage current of the sample 11.

In contrast, from the results in Table 1, it was found that the sample 7 having a PNN content of 6 [mol %] had the leakage current greater than that of the sample 11. It was also found that the sample 8 of 0.5 [mol %] had the leakage current similar to that of the sample 11. It was also found that the samples 9 and 10 containing neither Ni nor Nb had leakage currents greater than the leakage current of the sample 11. It was also found that the samples 9 and had the leakage currents greater than those of the samples 1 through 8 having a molar ratio of Ni to Nb of 1:2.

Test Example 3

For the samples 1 through 8 and the sample 11, a piezoelectric voltage coefficient g as one of the five performance indices (piezoelectric strain coefficient d, piezoelectric voltage coefficient g, electromechanical coupling coefficient k, mechanical quality coefficient Qm, and acoustic impedance Z) of a piezoelectric material was calculated to evaluate piezoelectric performance. In the present test example, a piezoelectric voltage coefficient g31 was calculated. The piezoelectric voltage coefficient g31 was obtained in accordance with the expression (5) below.

$$g31 = d31/(\varepsilon_0 \times K) \quad (5)$$

(where d31 denotes a piezoelectric strain coefficient, $\varepsilon_0$ denotes a dielectric constant in vacuum, and K denotes a relative dielectric constant.)

The piezoelectric strain coefficient d31 in the expression (5) was obtained by the expression (6) below.

$$d31 = \frac{-h_{Si}^2 \times S_{11 piezo} \times \delta}{3L^2 \times S_{11 Si} \times V} \quad (6)$$

(where $h_{Si}$ denotes Si substrate thickness, $S_{11\ Piezo}$ denotes compliance of the piezoelectric layer 70 (=reciprocal of Young's modulus of the piezoelectric layer 70), $\delta$ denotes a displacement, L denotes length of the cantilever, $S_{11\ Si}$ denotes compliance of the Si substrate (reciprocal of Young's modulus of the Si substrate), and V denotes applied voltage.)

In the test example 3, Young's moduli of the piezoelectric layers 70 in the samples 1 through 8 and the sample 11 were measured by a resonance method. In this context, the resonance method is a measuring method in which a test piece is subjected to mechanical or electrical forced vibration, and the resonance frequency (number of proper oscillation) is measured to calculate Young's modulus (coefficient of longitudinal elasticity) from the resonance frequency. In the present test example, the measurement was carried out using free resonance, which is a typical resonance method. Specifically, a test sample diced in a strip (3 mm×40 mm) was held by two suspension wires. Proper oscillation was generated by making a capacitor between a driving electrode and the test piece to be detected by a vibration sensor. Young's modulus was thus obtained and is indicated in Table 2. From the Young's modulus thus obtained and the displacement measured in the test example 1, the piezoelectric strain coefficient d31 was calculated based on expression (6), and the piezoelectric voltage coefficient g31 was calculated based on expression (5) and is indicated in Table 2. The film thicknesses and the relative dielectric constants of the piezoelectric layers 70 of the samples 1 through 8 and the sample 11 were as indicated in Table 2.

From the results in Table 2, the samples 1 through 6 having a PNN content of not less than 1 [mol %] and not more than 5 [mol %] had piezoelectric voltage coefficients g31 greater than the piezoelectric voltage coefficient of sample 11. In contrast, the sample 7 having a PNN content of 6 [mol %] and the sample 8 of 0.5 [mol %] had piezoelectric voltage coefficients g31 smaller than the piezoelectric voltage coefficient of the sample 11.

Other Embodiments

In the first embodiment, the ink jet recording head is described as an example of the liquid ejecting head, whereas an aspect of the invention is naturally applicable to a liquid ejecting head ejecting a liquid other than ink. Examples of the liquid ejecting head ejecting a liquid other than ink include color material ejecting heads used for manufacture of a color filter, such as a liquid crystal display, electrode material ejecting heads used for electrode formation, such as an organic EL display and a field emission display (FED), bio-organic ejecting heads used for production of bio chips, and the like.

In the first embodiment, the liquid ejecting head to be mounted in the liquid ejecting apparatus is described as an example of the piezoelectric element-applied device, whereas the application range of an aspect of the invention is not limited to this.

For example, an ultrasonic measuring device may be formed by including the piezoelectric element of an aspect of the invention and a control mechanism to measure a detection target using a signal based on at least one of an ultrasonic wave transmitted by the piezoelectric element of an aspect of the invention and an ultrasonic wave received by the piezoelectric element of an aspect of the invention.

Such an ultrasonic measuring device obtains information on the position, the shape, the speed, and the like of the measurement target based on the time from the time point of transmitting the ultrasonic wave to the time point of receiving an echo signal that is the transmitted ultrasonic wave returning after being reflected by the measurement target. For the ultrasonic measuring device, piezoelectric elements are sometimes used as the element to generate an ultrasonic wave and the element to detect the echo signal. It is possible to provide an ultrasonic measuring device having excellent displacement properties as such an ultrasonic wave generation element and echo signal sensing element.

The piezoelectric element-applied device of an aspect of the invention may be an ultrasonic motor, a temperature-electricity transducer, a pressure-electricity transducer, a piezoelectric transducer, a filter such as a filter for a harmful light, like infrared rays, a blocking filter, an optical filter using the photonic crystal effect by quantum dot formation, and an optical filter using light interference of a thin film. The piezoelectric element-applied device of an aspect of the invention may be a sensor other than the ultrasonic measuring device (ultrasonic sensor), for example, an infrared sensor, a heat sensitive sensor, a pressure sensor, or a gyro sensor (angular velocity sensor).

In addition, an aspect of the invention may be suitably used for a ferroelectric element. Examples of the suitably used ferroelectric element include a ferroelectric memory, a ferroelectric transistor (FeFET), a ferroelectric arithmetic circuit (FeLogic), a ferroelectric capacitor, and the like. The piezoelectric element of an aspect of the invention exhibits good pyroelectric properties and is thus suitable for a pyroelectric element. Further, an aspect of the invention is also applicable to a robot and the like using the motor described above as a driving source.

The entire disclosure of Japanese Patent Application Nos. 2015-191995, filed Sep. 29, 2015 and No. 2016-145733, filed Jul. 25, 2016, is expressly incorporated by reference herein.

What is claimed is:

1. A piezoelectric element comprising:
a first electrode;
a second electrode; and
a piezoelectric layer provided between the first and second electrodes, wherein
the piezoelectric layer is made from a perovskite composite oxide represented by formula (1) and
a total of Ni and Nb contents in the perovskite composite oxide is not less than 1 [mol %] and not more than 2.5 [mol %] based on a total content of elements contained in a B site $$Pb(Ni,Nb,Zr,Ti)O_3 \qquad (1).$$

2. The piezoelectric element according to claim 1, wherein the piezoelectric layer is made from a perovskite composite oxide represented by formula (2) below $$xPb(Ni,Nb)O_3-(1-x)Pb(Zr,Ti)O_3 \qquad (2)$$

(where $0.01 \leq x \leq 0.05$ is satisfied).

3. The piezoelectric element according to claim 1, wherein the piezoelectric layer has a molar ratio of Ni to Nb contained in the perovskite composite oxide represented by the formula (1) or (2) of 1:2.

4. A piezoelectric element-applied device comprising the piezoelectric element according to claim 1.

5. A piezoelectric element-applied device comprising the piezoelectric element according to claim 2.

6. A piezoelectric element-applied device comprising the piezoelectric element according to claim 3.

* * * * *